(12) United States Patent
Liu (10) Patent No.: US 11,183,671 B2
(45) Date of Patent: Nov. 23, 2021

(54) ELECTROLUMINESCENT DISPLAY AND ILLUMINATING DEVICE AND MANUFACTURED METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Yang Liu, Shenzhen (CN)

(*) Notice: Subject to any disclaimer, the term of this patent is extended or adjusted under 35 U.S.C. 154(b) by 234 days.

(21) Appl. No.: 16/618,366

(22) PCT Filed: Nov. 11, 2019

(86) PCT No.: PCT/CN2019/116951
§ 371 (c)(1),
(2) Date: Dec. 1, 2019

(87) PCT Pub. No.: WO2021/008027
PCT Pub. Date: Jan. 21, 2021

(65) Prior Publication Data
US 2021/0336228 A1    Oct. 28, 2021

(30) Foreign Application Priority Data

Jul. 17, 2019 (CN) .......................... 201910645920.1

(51) Int. Cl.
*H01L 51/52* (2006.01)
*H01L 27/32* (2006.01)
*H01L 51/50* (2006.01)

(52) U.S. Cl.
CPC ...... *H01L 51/5278* (2013.01); *H01L 27/3209* (2013.01); *H01L 27/3267* (2013.01); *H01L 51/5221* (2013.01); *H01L 27/322* (2013.01); *H01L 51/5044* (2013.01); *H01L 2251/5353* (2013.01)

(58) Field of Classification Search
CPC .................................................. H01L 27/3267
See application file for complete search history.

(56) References Cited

U.S. PATENT DOCUMENTS

| | | | |
|---|---|---|---|
| 2006/0006792 A1* | 1/2006 | Strip | H01L 27/3209 313/500 |
| 2007/0114522 A1 | 5/2007 | Kwok et al. | |
| 2014/0167626 A1 | 6/2014 | Kim et al. | |
| 2018/0366527 A1 | 12/2018 | Xu | |
| 2019/0006433 A1 | 1/2019 | Peng et al. | |

FOREIGN PATENT DOCUMENTS

| | | |
|---|---|---|
| CN | 103872251 A | 6/2014 |
| CN | 106129099 A | 11/2016 |
| CN | 106684072 A | 5/2017 |
| CN | 107104132 A | 8/2017 |
| CN | 108777259 A | 11/2018 |

\* cited by examiner

*Primary Examiner* — Daniel P Shook (57) ABSTRACT

An electroluminescent display and illuminating device and a manufacturing method thereof are provided. Layers of light-emitting devices of an electroluminescent display and an electroluminescent illuminator are assembled, and the two devices share an electrode in a middle of a laminated structure, thereby realizing a display function on one side of the device and realizing a illumination function on the other side of the device, so that a shape design of a product can be more flexible.

20 Claims, 3 Drawing Sheets

| |
|---|
| protective structure 431 |
| second anode 430 |
| second hole injection layer 429 |
| third hole transport layer 428 |
| third light emission layer 427 |
| third electron transport layer 426 |
| second electron injection layer 425 |
| total reflection cathode 424 |
| first electron injection layer 423 |
| second electron transport layer 422 |
| second light emission layer 421 |
| second hole transport layer 420 |
| p-type charge generation layer 419 |
| n-type charge generation layer 418 |
| first electron transport layer 417 |
| first light emission layer 416 |
| first hole transport layer 415 |
| first hole injection layer 414 |
| patterned first anode 413 |
| TFT array layer 412 |
| CF array layer 411 |
| substrate 410 |
| polarizer 409 |

FIG. 4

| |
|:---:|
| protective structure 530 |
| second cathode 529 |
| second electron injection layer 528 |
| third electron transport layer 527 |
| third light emission layer 526 |
| third hole transport layer 525 |
| p-type charge generation layer 524 |
| n-type charge generation layer 523 |
| second electron transport layer 522 |
| second light emission layer 521 |
| second hole transport layer 520 |
| second hole injection layer 519 |
| total reflection anode 518 |
| first hole injection layer 517 |
| first hole transport layer 516 |
| individual red/green/blue light emission layers 515 |
| first electron transport layer 514 |
| first electron injection layer 513 |
| patterned first cathode 512 |
| TFT array layer 511 |
| substrate 510 |
| polarizer 509 |

FIG. 5

ELECTROLUMINESCENT DISPLAY AND ILLUMINATING DEVICE AND MANUFACTURED METHOD THEREOF

FIELD OF DISCLOSURE

The present disclosure relates to the field of electroluminescent devices, and in particular, to an electroluminescent display and illuminating device with laminated electrodes and a manufacturing method thereof.

BACKGROUND

An organic light-emitting diode (OLED) is a thin film structure formed on a substrate, and generally includes an anode, a cathode, and an organic light-emitting unit sandwiched between the two electrodes. Driven by an external voltage, holes and electrons of the organic light-emitting unit are injected from the anode and the cathode to an organic semiconductor, respectively, and transmitted to a light emission layer to form exciton radiation on a luminescent material. The OLED technology based on a principle of electroluminescence has two main applications, one is applied in the field of display technologies, and the other is applied in the field of illumination technologies.

In the field of display technologies, small-size displays (e.g., smart watches, mobile phones, tablets, etc.) are mainly used for OLED devices with light emission layers arranged side-by-side, in which three red/green/blue (R/G/B) light emission layers are arranged side-by-side, and emit three colors of light to realize full color display. Large-size displays (e.g., TVs, etc.) are mainly used in white light OLED (WOLED) devices with laminated light emission layers, in which a plurality of light emission layers together in tandem by a charge generation layer to emit white light, and then full color display is realized by a color filter. The OLED display technologies have many advantages over liquid crystal display (LCD) technologies, such as one of the most important features is that the OLED can flexibly realize the formation of display, so that the display picture is no longer limited to a plane. For example, OLED displays can be bent, folded, or even curled.

In the field of illumination technologies, a certain color illumination is achieved by a monochromatic device, such as a red or yellow OLED for a car taillight. Also, white light illumination is achieved by a tandem device having a plurality of different color light emission layers, such as a ceiling light that can emit warm white light, a desk lamp, and the like. OLED illumination can flexibly realize the formation of illumination sources. The illumination sources can be designed as a point source, a line source, a surface source, or a patterned source, and the surface source can also be a planar source or a curved source.

Figure 1:
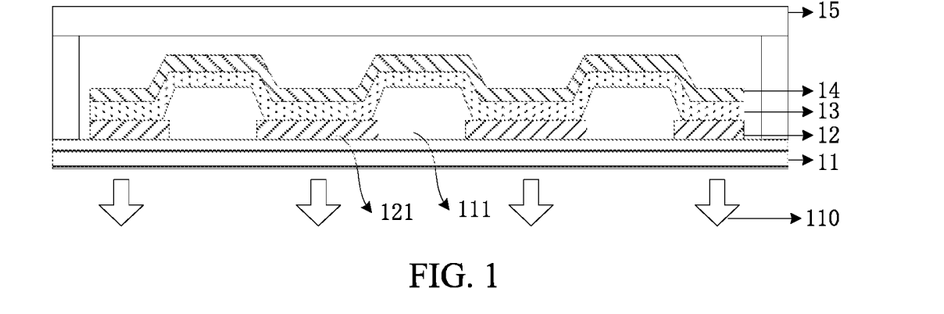
FIG. 1 is a schematic diagram of a layered structure of a bottom emission electroluminescent display device in the prior art.

Please refer to FIG. 1, which is a schematic diagram of a layered structure of a bottom emission electroluminescent display device in the prior art. The display device includes a TFT array substrate 11, a patterned first electrode 12, an OLED material layer 13, a second electrode 14, and a cover 15. The patterned first electrode 12 is formed on the TFT array substrate 11. The first electrode 12 includes a plurality of first sub-electrodes 121 separated by a pixel definition layer (PDL) 111. The OLED material layer 13 is formed on the first electrode 12 and the pixel definition layer 111. The second electrode 14 is formed on the OLED material layer 13. The cover 15 is formed on the second electrode 14. An OLED display device is formed from the first electrode 12 to the second electrode 14. The first electrode 12 and the second electrode 14 are connected to opposite polarity. The OLED display device is driven by the TFT array substrate 11 to achieve a display function. When the first electrode 12 and the second electrode 14 are energized, the electroluminescent display device can be illuminated, and light is emitted from a side of the TFT array substrate 11 (as shown by a downward arrow 110 in the figure).

Figure 2:
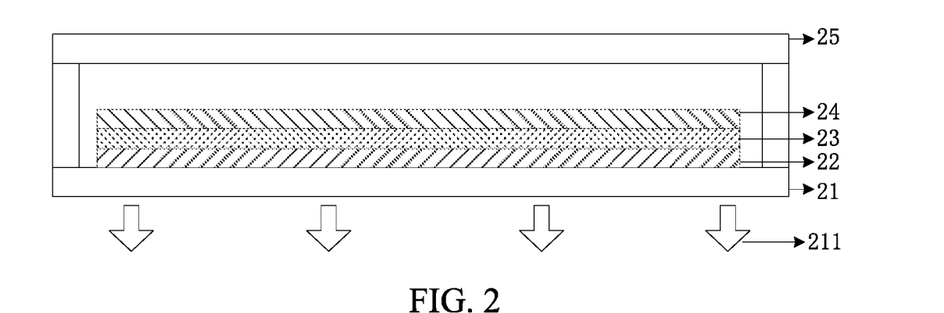
FIG. 2 is a schematic diagram of a layered structure of an electroluminescent illuminator in the prior art.

Please refer to FIG. 2, which is a schematic diagram of a layered structure of an electroluminescent illuminator in the prior art. The illuminating device includes a substrate 21, a first electrode 22, an OLED material layer 23, a second electrode 24, and a cover 25. The first electrode 22 is formed on the substrate 21. The OLED material layer 23 is formed on the first electrode 22. The second electrode 24 is formed on the OLED material layer 23. The cover 25 is formed on the second electrode 24. An OLED illuminator is formed from the first electrode 22 to the second electrode 24, and the first electrode 22 and the second electrode 24 are connected to opposite polarity. When the first electrode 22 and the second electrode 24 are energized, the electroluminescent illuminating device can be illuminated, and light is emitted is from a side of the substrate 21 (as shown by a downward arrow 211 in the figure).

In the prior art, the electroluminescent display device and the electroluminescent illuminating device are individual devices, and the display device and the light illuminating device are not stacked together. Also, there is no an electroluminescent display and illuminating device can achieve that a display function is realized on a side of the device and a illumination function is realized on the other side of the device.

Therefore, in view of disadvantages of the prior art, an electroluminescence display and illuminating device formed by assembling a display device and an illuminating device, so that a display function is realized on a side of the device and a illumination function is realized on the other side of the device, so as to overcome shortcomings of the prior art. It is a technical problem that needs to be solved urgently in a development of OLED technologies based on a principle of electroluminescence.

SUMMARY OF DISCLOSURE

An object of the present disclosure is to provide an electroluminescent display and illuminating device and a manufacturing method thereof to overcome the problems existing in the prior art. Layers of light-emitting devices of a display device and an illuminating device are assembled, so as to realize a display function on one side of the device and a illumination function on the other side of the device. Also, a thickness of the device can be reduced, so that it is possible to design a shape of the product more flexibly.

In order to achieve the above object, the present disclosure provides an electroluminescent display and illuminating device. The electroluminescent display and illuminating device includes a thin film transistor (TFT) array substrate, a first electrode, a first electroluminescent unit, an intermediate electrode, a second electroluminescent unit, a second electrode, and a protective structure. The first electrode and the first electroluminescent unit are sequentially disposed on the TFT array substrate. The first electroluminescent unit includes at least one light emission layer, and the first electrode is a patterned electrode and includes a plurality of first sub-electrodes which are spaced apart from each other. The intermediate electrode is formed on the first electroluminescent unit. The intermediate electrode is a total reflection electrode. The second electroluminescent unit and the second electrode are sequentially disposed on the intermediate electrode. The second electroluminescent unit includes at least one light emission layer. The protective structure is formed on the second electrode. The first electrode, the first electroluminescent unit, and the intermediate electrode form an electroluminescent display. The TFT array substrate is configured to drive the electroluminescent display to achieve a display function. The intermediate electrode, the second electroluminescent unit, and the second electrode form an electroluminescent illuminator. The first electrode and the second electrode are connected to the same polarity, and the intermediate electrode and the first electrode are connected to opposite polarity, thereby achieving the display function on a side of the TFT array substrate, and achieving a illumination function on a side of the protective structure. In response to the first electrode and the intermediate electrode being simultaneously energized, the electroluminescent display is simultaneously illuminated to enable the display function, and light is emitted from the side of the TFT array substrate relative to the protective structure. In response to the intermediate electrode and the second electrode being simultaneously energized, the electroluminescent illuminator is illuminated to enable the illumination function, and light is emitted from the side of the protective structure relative to the TFT array substrate. In response to the first electrode, the intermediate electrode, and the second electrode being simultaneously energized, the electroluminescent display and the electroluminescent illuminator are simultaneously illuminated to enable the display function and the illumination function at the same time.

In order to achieve the above object, the present disclosure also provides an electroluminescent display and illuminating device. The electroluminescent display and illuminating device includes a thin film transistor (TFT) array substrate, a first electrode, a first electroluminescent unit, an intermediate electrode, a second electroluminescent unit, a second electrode, and a protective structure. The first electrode and the first electroluminescent unit are sequentially disposed on the TFT array substrate. The first electroluminescent unit includes at least one light emission layer. The intermediate electrode is formed on the first electroluminescent unit. The second electroluminescent unit and the second electrode are sequentially disposed on the intermediate electrode. The second electroluminescent unit includes at least one light emission layer. The protective structure is formed on the second electrode. The first electrode, the first electroluminescent unit, and the intermediate electrode form an electroluminescent display. The TFT array substrate is configured to drive the electroluminescent display to achieve a display function. The intermediate electrode, the second electroluminescent unit, and the second electrode form an electroluminescent illuminator. The first electrode and the second electrode are connected to the same polarity, and the intermediate electrode and the first electrode are connected to opposite polarity, thereby achieving the display function on a side of the TFT array substrate, and achieving a illumination function on a side of the protective structure.

In order to achieve the above object, the present disclosure also provides a manufacturing method of an electroluminescent display and illuminating device, including steps as follows: providing a thin film transistor (TFT) array substrate; sequentially disposing a first electrode and a first electroluminescent unit on the TFT array substrate, where the first electroluminescent unit includes at least one light emission layer; forming an intermediate electrode on the first electroluminescent unit; sequentially disposing a second electroluminescent unit and a second electrode on the intermediate electrode, where the second electroluminescent unit includes at least one light emission layer; forming a protective structure on the second electrode; and connecting the first electrode and the second electrode to the same polarity, and connecting the intermediate electrode and the first electrode to opposite polarity, thereby achieving a display function on a side of the TFT array substrate, and achieving a illumination function on a side of the protective structure.

Advantages of the present disclosure are as follows. In the present disclosure, layers of light-emitting devices of an electroluminescent display and an electroluminescent illuminator are assembled, and the two devices share an electrode in a middle of a laminated structure, thereby realizing a display function on one side of the device and realizing a illumination function on the other side of the device. In the prior art, a complete display device and an illumination device are assembled in a back-to-back arrangement to realize of display and illumination at the same time. In comparison to the prior art, the present disclosure can reduce a thickness of the device, so that a shape design of the product can be more flexible, and the application is widely used and popularized.

BRIEF DESCRIPTION OF DRAWINGS

To illustrate the technical solutions according to the embodiments of the present disclosure more clearly, the drawings to be used in the description of the embodiments are described briefly hereinafter. Apparently, the drawings in the following description are only some embodiments of the present disclosure. For those skilled in the art, other drawings may be obtained based on these drawings without any creative effort.

DETAILED DESCRIPTION

The embodiments of the present disclosure will be described in detail below with reference to the accompanying drawings in which same or similar reference numerals indicate the same or similar elements, or elements with same or similar function. The embodiments described below with reference to the accompanying drawings are exemplary and are merely used to explain the present disclosure, but should not be construed as limiting the present disclosure.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on,"

"above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides a plurality of different embodiments or examples to implement different structures of this application. To simplify the disclosure of this application, the following describes components and settings in particular examples. Certainly, the examples are merely for illustrative purposes, and are not intended to limit this application. In addition, in this application, reference numerals and/or reference letters may be repeated in different examples. This repetition is for the purpose of simplicity and clarity, and does not in itself indicate a relationship between the various embodiments and/or settings that are discussed.

The present disclosure proposes an electroluminescent display and illuminating device, which is formed by stacking an electroluminescent display and an electroluminescent illuminator, and the two devices share an electrode in a middle of a laminated structure to realize a display function on one side of the device and realize a illumination function on the other side of the device.

Figure 3:
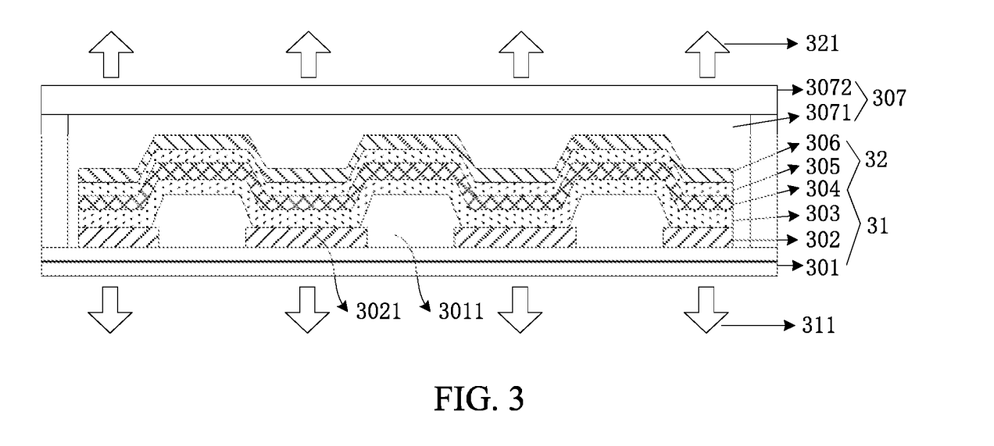
FIG. 3 is a schematic diagram of a layered structure of an electroluminescent display and illuminating device of an embodiment of the present disclosure.

Please refer to FIG. 3, which is a schematic diagram of a layered structure of an electroluminescent display and illuminating device of an embodiment of the present disclosure. The device includes a thin film transistor (TFT) array substrate 301, a first electrode 302, a first electroluminescent unit 303, an intermediate electrode 304, a second electroluminescent unit 305, a second electrode 306, and a protective structure 307. The first electrode 302 and the first electroluminescent unit 303 are sequentially disposed on the TFT array substrate 301. The first electroluminescent unit 303 includes at least one light emission layer (not shown in the drawing). The intermediate electrode 304 is formed on the first electroluminescent unit 303. The second electroluminescent unit 305 and the second electrode 306 are sequentially disposed on the intermediate electrode 304. The second electroluminescent unit 305 includes at least one light emission layer (not shown in the drawing). The protective structure 307 is formed on the second electrode 306. The first electrode 302 and the second electrode 306 are connected to the same polarity, and the intermediate electrode 304 and the first electrode 302 are connected to opposite polarity, thereby achieving a display function on a side of the TFT array substrate 301, and achieving a illumination function on a side of the protective structure 307. The first electrode 302, the first electroluminescent unit 303, and the intermediate electrode 304 are sequentially laminated to form an electroluminescent display 31. The TFT array substrate 301 is configured to drive the electroluminescent display 31 to achieve the display function. The intermediate electrode 304, the second electroluminescent unit 305, and the second electrode 306 are sequentially laminated to form an electroluminescent illuminator 32.

As a common knowledge in the art, the TFT array substrate 301 is a laminated structure including TFTs, and a manufacturing process thereof will not be described herein.

Specifically, when the first electrode 302 and the intermediate electrode 304 are simultaneously energized, the electroluminescent display 31 is illuminated to enable a display function. The light is emitted from one side of the TFT array substrate 301 relative to the protective structure 307 (as shown by a downward arrow 311 in the drawing). When the intermediate electrode 304 and the second electrode 306 are simultaneously energized, the electroluminescent illuminator 32 is illuminated to enable a illumination function. The light is emitted from one side of the protective structure 307 relative to the TFT array substrate 301 (as shown by an upward arrow 321 in the drawing). When the first electrode 302, the intermediate electrode 304, and the second electrode 306 are simultaneously energized, the electroluminescent display 31 and the electroluminescent illuminator 32 are simultaneously illuminated to enable the display function and the illumination function at the same time.

Alternatively, the electroluminescent display 31 further includes a color filter (CF). The color filter is configured to filter colors to obtain red/green/blue (R/G/B) monochromatic lights. Corresponding red/green/blue (R/G/B) pixels are controlled by the TFT array substrate 301, thereby realizing full color display. Alternatively, the first electroluminescent unit 303 employs individual red/green/blue (R/G/B) light emission layers to respectively emit red/green/blue (R/G/B) monochromatic lights. Moreover, corresponding red/green/blue (R/G/B) pixels are controlled by the TFT array substrate 301, thereby realizing full color display.

Alternatively, the electroluminescent display 31 is any one of a single stack device, a multi-stack device, an upright device, or an inverted device. Alternatively, the electroluminescent illuminator 32 is any one of a single stack device, a multi-stack device, an upright device, or an inverted device.

Alternatively, the electroluminescent display 31 is a light-emitting device including an organic light-emitting diode (OLED), a quantum dot light-emitting diode (QLED), or a combination of both. Alternatively, the electroluminescent illuminator 32 is a light-emitting device including an organic light-emitting diode, a quantum dot light-emitting diode, or a combination of both.

In a further embodiment, the first electrode 302 is a patterned electrode, and includes a plurality of first sub-electrodes 3021 which are spaced apart from each other (in this embodiment, the plurality of first sub-electrodes 3021 are separated by a pixel definition layer 3011). The intermediate electrode 304 and the second electrode 306 are full-surface electrodes.

In a further embodiment, the intermediate electrode 304 is a total reflection electrode. The intermediate electrode 304 employs an opaque total reflection electrode such that light emitted by the electroluminescent display 31 and light emitted by the electroluminescent illuminator 32 do not interfere with each other. The intermediate electrode 304 is a single layer electrode structure made of a metal material, or a 3-layer electrode structure laminated in an order of metal oxide/metal/metal oxide. A thickness of the intermediate electrode is greater than or equal to 50 nm, and preferably, the thickness is greater than or equal to 100 nm.

As a common knowledge in the art, the electroluminescent unit is a laminated structure prepared by evaporation, and the preparation process thereof will not be described herein. It should be noted that the number of light emission layers of the electroluminescent unit can be flexibly set as needed, such as two, three, five, or other.

In a further embodiment, the first electroluminescent unit 303 is configured to emit a monochromatic light or a multi-band mixed light. The second electroluminescent unit 305 is configured to emit a monochromatic light or a multi-band mixed light. For example, the first electroluminescent unit 303 may include a first light emission layer and a second light emission layer. The first light emission layer is configured to emit blue light. The second light emission layer is configured to emit yellow light. A white light formed by the blue light and the yellow light can be filtered by a color filter to obtain red/green/blue (R/G/B) monochromatic lights. The second electroluminescent unit 305 can include a light emission layer. The light emission layer is configured to emit monochromatic light or white light. The second electroluminescent unit 305 can include two light emission layers. The two light emission layers can be configured to emit light of the same color or light of different colors.

In a further embodiment, the first electroluminescent unit 303 and/or the second electroluminescent unit 305 includes at least two light emission layers. A first charge generation layer and a second charge generation layer are disposed between the adjacent light emission layers of the same electroluminescent unit, and the first charge generation layer and the second charge generation layer are different types of charge generation layers. For example, the first charge generation layer is an n-type charge generation layer, and the second charge generation layer is a p-type charge generation layer.

In a further embodiment, the first electroluminescent unit 303 and the second electroluminescent unit 305 are each provided with a carrier injection layer and a transport layer between the light emission layer and the adjacent electrodes. The carrier injection layer is a hole injection structure, the transport layer is a hole transport layer, or the carrier injection layer is an electron injection structure, and the transport layer is an electron transport layer.

In a further embodiment, the protective structure 307 includes an encapsulation structure 3071 and a cover 3072 which are sequentially formed on the second electrode 306. A purpose is to prevent permeation of external moisture and oxygen that may cause damage to the electroluminescent display 31 and the electroluminescent illuminator 32 to ensure a lifespan of the device. In other embodiments, the protective structure 307 may also be a thin film encapsulation layer formed on the second electrode 306. It is also possible to prevent permeation of external moisture and oxygen that may cause damage to the device and ensure the lifespan of the device. The preparation process of the encapsulation structure 3071 or the thin film encapsulation layer can refer to the prior art, and details are not described herein again.

The electroluminescent display and illuminating device provided by the present disclosure can have a variety of applications, including but not limited to as follows. The device is installed on one of walls of a room so that the display device or illumination source can be switched as needed. The device is mounted in a hollow wall or on a stand, and the display function is realized on one side of the device and a illumination function is realized on the other side of the device. The device is applied to a traffic signal in which traffic information is displayed on one side of the device and traffic illumination is provided on the other side of the device. The device is applied in an in-vehicle device, so that the display device or illumination source can be switched as needed. The device is applied to a medical device so that the display device or illumination source can be switched as needed. The device is applied to a box (for example, a suitcase), in which the display surface of the device faces outward, and can be used as a touch operation panel, and the illumination surface of the device faces inward, and can be used as an illumination source in the box.

In the present disclosure, layers of light-emitting devices of the electroluminescent display and the electroluminescent illuminator are assembled, so that the display function is realized on one side of the device and the illumination function is realized on the other side of the device. In the prior art, a complete display device and an illumination device are assembled in a back-to-back arrangement to realize of display and illumination at the same time. In comparison to the prior art, the present disclosure can reduce a thickness of the device, so that a shape design of the product can be more flexible, and the application is widely used and popularized.

Based on the same application concept, the present disclosure further provides a manufacturing method of an electroluminescent display and illuminating device, the method includes the following steps. A thin film transistor (TFT) array substrate is provided. A first electrode and a first electroluminescent unit are sequentially disposed on the TFT array substrate. The first electroluminescent unit includes at least one light emission layer. An intermediate electrode is formed on the first electroluminescent unit. A second electroluminescent unit and a second electrode are sequentially disposed on the intermediate electrode. The second electroluminescent unit includes at least one light emission layer. A protective structure is formed on the second electrode. The first electrode and the second electrode are connected to the same polarity. The intermediate electrode and the first electrode are connected to opposite polarity. Thus, a display function is realized on a side of the TFT array substrate, and a illumination function is realized on a side of the protective structure. In manufacturing method of the present disclosure, layers of light-emitting devices of the electroluminescent display and the electroluminescent illuminator are assembled, so that the display function is realized on one side of the device and the illumination function is realized on the other side of the device. The present disclosure can reduce a thickness of the device, so that a shape design of the product can be more flexible, and the application is widely used and popularized.

Figure 4:
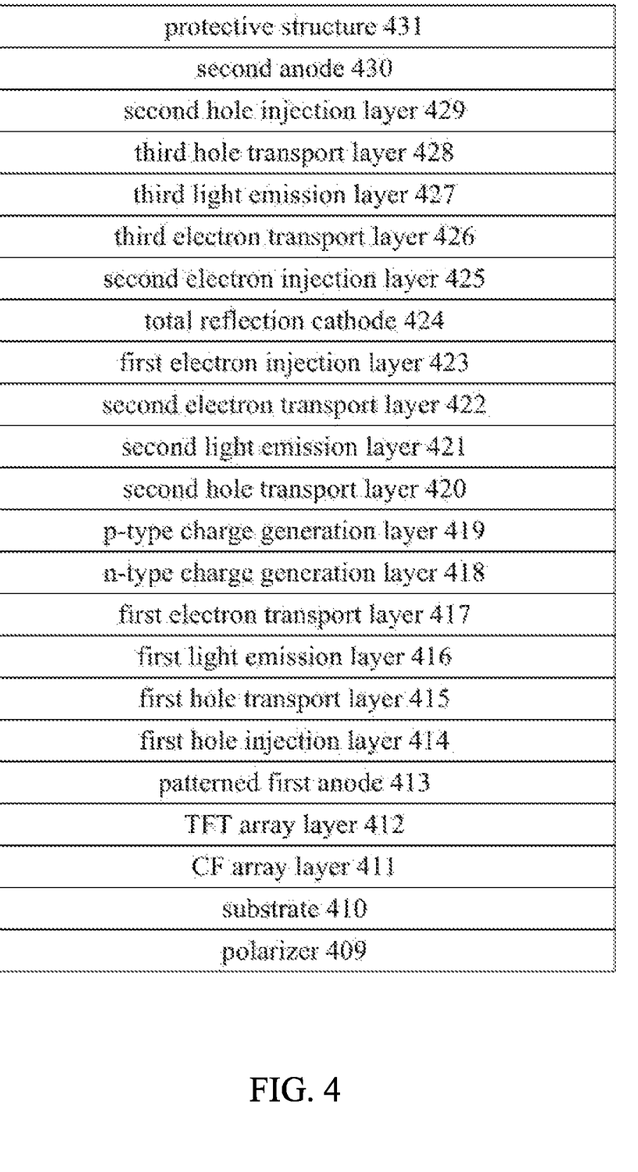
FIG. 4 is a schematic diagram of a layered structure of an electroluminescent display and illuminating device of a first embodiment of the present disclosure.

Please refer to FIG. 4, which is a schematic diagram of a layered structure of an electroluminescent display and illuminating device of a first embodiment of the present disclosure. The electroluminescent display and illuminating device of this embodiment consists of an upright two-stack OLED display device and a single-stack OLED illuminator. The specific preparation process is as follows.

1) A substrate 410 is provided. A color film (CF) array layer 411 and a thin film transistor (TFT) array layer 412 are formed on the substrate 410 by coating, exposing, developing, curing, and film formation, yellow light, etching, and the like. The CF array layer 411 is used to filter colors to obtain red/green/blue (R/G/B) monochromatic lights, and the TFT array layer 412 is used to drive the electroluminescent display to realize full color display.

2) A patterned first anode (anode 1) 413 (i.e., a first electrode) is formed on the above-prepared TFT array layer 412 by a process of film formation, yellow light, etching, or the like.

3) A first hole injection layer (HIL 1) 414, a first hole transport layer (HTL 1) 415, a first light emission layer (EML 1) 416, a first electron transport layer (ETL 1) 417, a n-type charge generation layer (n-CGL) 418, a p-type charge generation layer (p-CGL) 419, a second hole transport layer (HTL 2) 420, a second light emission layer (EML 2) 421, a second electron transport layer (ETL 2) 422, and a first electron injection layer (EIL 1) 423 are sequentially formed on the first substrate 413 by an evaporation process or a solution process. Through this step, an organic luminescent material layer (i.e., a first electroluminescent unit) of an electroluminescent display is formed.

4) An opaque total reflection cathode 424 (i.e., an intermediate electrode) is formed on the first electron injection layer 423. The opaque total reflection cathode 424 is used so that the light emitted by the electroluminescent display and the light emitted by the electroluminescent illuminator do not interfere with each other. Material of the cathode 424 is a metal, and may be a metal material having good conductivity, such as Al, Ag, or the like. Also, a thickness of the cathode 424 is greater than or equal to 50 nm. Preferably, the thickness of the cathode 424 is greater than or equal to 100 nm.

Therefore, from the first anode 413 to the cathode 424, a 2-stack tandem organic electroluminescent display (OLED display device) is formed. The first light emission layer 416 can be set to emit blue light. The second light emission layer 421 can be set to emit yellow light. White light formed by the blue light and the yellow light can be filtered through CF array layer 411 to obtain red/green/blue (R/G/B) monochromatic lights. Corresponding red/green/blue (R/G/B) pixels are controlled by the TFT array layer 412, thereby realizing the display function of the OLED display device, and the light is emitted from a side of the substrate 410.

5) A second electron injection layer (EIL 2) 425, a third electron transport layer (ETL 3) 426, a third light emission layer (EML 3) 427, a third hole transport layer (HTL 3) 428, a second hole injection layer (HIL 2) 429 are sequentially formed on the cathode 424 by an evaporation process. Hence, an organic luminescent material layer (i.e., a second electroluminescent unit) of the electroluminescent illuminator is formed.

6) A second anode (anode 2) 430 (i.e., a second electrode) is formed on the second hole injection layer 429.

Thus, a single-layer organic electroluminescent illuminator (OLED illuminator) is formed from the cathode 424 to the second anode 430. The third light emission layer 427 emits light of a certain color or white light, and the light is emitted through the second anode 430 to realize the function of illumination.

7) A protective structure 431 is formed on the second anode 430. The protective structure 431 may be an assemble of an encapsulation structure and a cover formed on the second anode 430 in sequence, or a thin film encapsulation layer formed on the second anode 430. The protective structure 431 is configured to prevent permeation of external moisture and oxygen that may cause damage to the light-emitting device, and to ensure the lifespan of the light-emitting device.

8) In this embodiment, at least one polarizer 409 is attached to the side of the substrate 410 away from the light emitting device.

The layered structure of electroluminescent display and illuminating device prepared by the above preparation process is shown in FIG. 4. Layers of light-emitting devices of the electroluminescent display and the electroluminescent illuminator are assembled, so that the display function is realized on one side of the device and the illumination function is realized on the other side of the device. The present disclosure can reduce a thickness of the device, so that a shape design of the product can be more flexible.

In other embodiments, a touch control layer, a protective layer, and the like may be formed on the side of the polarizer 409 away from the substrate 410 according to an actual application.

Figure 5:
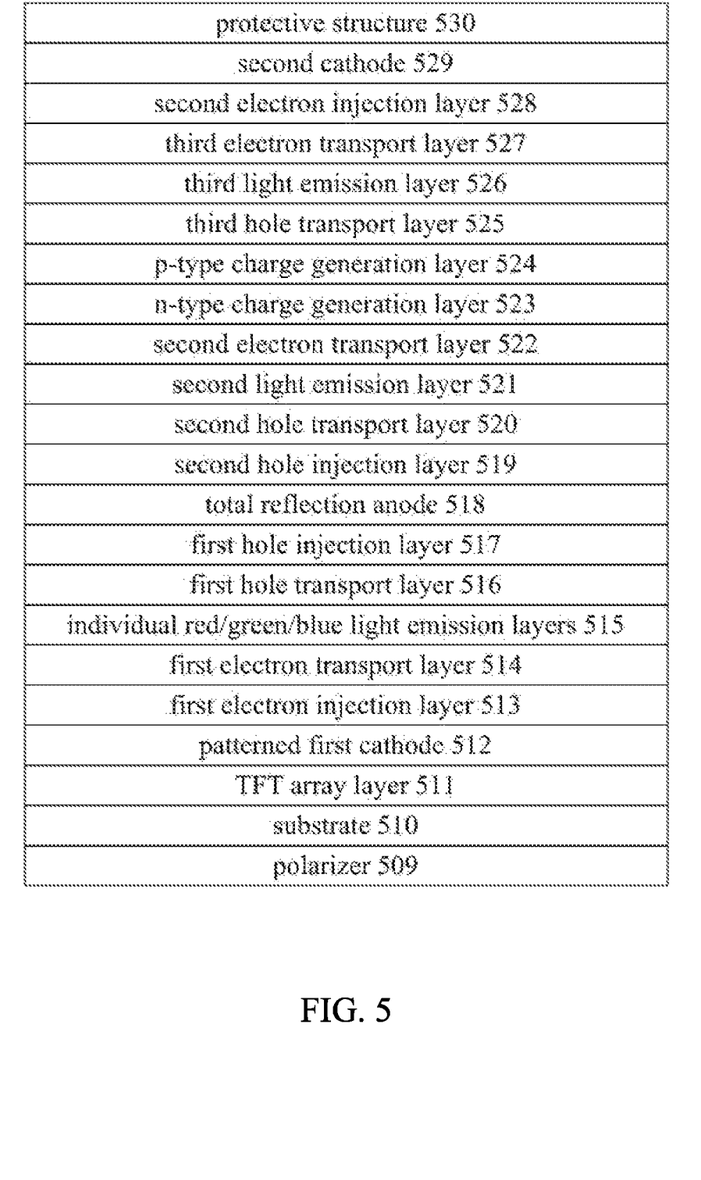
FIG. 5 is a schematic diagram of a layered structure of an electroluminescent display and illuminating device of a second embodiment of the present disclosure.

Please refer to FIG. 5, which is a schematic diagram of a layered structure of an electroluminescent display and illuminating device of a second embodiment of the present disclosure. The electroluminescent display and illuminating device of this embodiment consists of an inverted single-stack RGB-OLED display device and an upright two-stack tandem OLED illuminator. The specific preparation process is as follows.

1) A substrate 510 is provided. A thin film transistor (TFT) array layer 511 is formed on the substrate 510 by coating, exposing, developing, curing, and film formation, yellow light, etching, and the like. The TFT array layer 511 is used to drive the electroluminescent display.

2) A patterned first cathode (cathode 1) 512 (i.e., a first electrode) is formed on the above-prepared TFT array layer 511 by a process of film formation, yellow light, etching, or the like.

3) A first electron injection layer (EIL 1) 513 and a first electron transport layer (ETL 1) 514 are sequentially formed on the first cathode 512 by an evaporation process or a solution process. Patterned individual red/green/blue (R/G/B) light emission layers (red/green/blue (R/G/B)-EML) 515 are formed at positions corresponding to different pixels on the first electron transport layer 514. A first hole transport layer (HTL 1) 516, a first hole injection layer (HIL 1) 517 are sequentially formed on the individual red/green/blue (R/G/B) light emission layers 515. Through this step, an organic luminescent material layer (i.e., a first electroluminescent unit) of the electroluminescent display is formed.

4) An opaque total reflection anode 518 (i.e., an intermediate electrode) is formed on the first hole injection layer 517. The opaque total reflection anode 518 is employed so that the light emitted by the electroluminescent display and the light emitted by the electroluminescent illuminator do not interfere with each other. The anode 518 can be a single layer electrode structure made of a metal material, or a 3-layer electrode structure (i.e., a sandwich electrode structure) laminated in an order of metal oxide/metal/metal oxide.

Thus, from the first cathode 512 to the anode 518, an inverted single-stack individual red/green/blue (R/G/B) electroluminescent display (RGB-OLED display device) is formed. Light is emitted through the first cathode 512. The corresponding red/green/blue (R/G/B) pixels are controlled by the TFT array layer 511, thereby realizing the display function.

5) A second hole injection layer (HIL 2) 519, a second hole transport layer (HTL 2) 520, a second light emission layer (EML 2) 521, a second electron transport layer (ETL 2) 522, a n-type charge generation layer (n-CGL) 523, a p-type charge generation layer (p-CGL) 524, a third hole transport layer (HTL 3) 525, a third light emission layer (EML 3) 526, a third electron transport layer (ETL 3) 527, and a second electron injection layer (EIL 2) 528 are sequentially formed on the anode 518 by an evaporation process. Hence, an organic luminescent material layer (i.e., a second electroluminescent unit) of the electroluminescent illuminator is formed.

6) A second cathode (cathode 2) 529 (i.e., a second electrode) is formed on the second electron injection layer 528.

Thus, from the anode 518 to the second cathode 529, an upright 2-stack tandem electroluminescent illuminator (OLED illuminator) is formed. The second light emission layer 521 and the third light emission layer 526 may emit light of the same color or light of a different color. Light is emitted through the second cathode 529, to achieve the function of illumination.

7) A protective structure 530 is formed on the second cathode 529. The protective structure 530 may be an assemble of an encapsulation structure and a cover formed on the second cathode 529 in sequence, or a thin film encapsulation layer formed on the second cathode 529. The protective structure 530 is configured to prevent permeation of external moisture and oxygen that may cause damage to the light-emitting device, and to ensure the lifespan of the light-emitting device.

8) In this embodiment, at least one polarizer 509 is attached to the side of the substrate 510 away from the light emitting device.

The layered structure of electroluminescent display and illuminating device prepared by the above preparation process is shown in FIG. 5. Layers of light-emitting devices of the electroluminescent display and the electroluminescent illuminator are assembled, so that the display function is realized on one side of the device and the illumination function is realized on the other side of the device. The present disclosure can reduce a thickness of the device, so that a shape design of the product can be more flexible.

In other embodiments, a touch control layer, a protective layer, and the like may be formed on the side of the polarizer 509 away from the substrate 510 according to an actual application.

The subject matter of the present disclosure can be manufactured and used in the industry with industrial applicability.

What is claimed is:

1. An electroluminescent display and illuminating device, comprising:
   a thin film transistor (TFT) array substrate;
   a first electrode and a first electroluminescent unit sequentially disposed on the TFT array substrate, wherein the first electroluminescent unit comprises at least one light emission layer, and the first electrode is a patterned electrode and comprises a plurality of first sub-electrodes which are spaced apart from each other;
   an intermediate electrode formed on the first electroluminescent unit, wherein the intermediate electrode is a total reflection electrode;
   a second electroluminescent unit and a second electrode sequentially disposed on the intermediate electrode, wherein the second electroluminescent unit comprises at least one light emission layer; and
   a protective structure formed on the second electrode;
   wherein the first electrode, the first electroluminescent unit, and the intermediate electrode form an electroluminescent display, and the TFT array substrate is configured to drive the electroluminescent display to achieve a display function; the intermediate electrode, the second electroluminescent unit, and the second electrode form an electroluminescent illuminator;
   the first electrode and the second electrode are connected to the same polarity, and the intermediate electrode and the first electrode are connected to opposite polarity, thereby achieving the display function on a side of the TFT array substrate, and achieving a illumination function on a side of the protective structure;
   in response to the first electrode and the intermediate electrode being simultaneously energized, the electroluminescent display is simultaneously illuminated to enable the display function, and light is emitted from the side of the TFT array substrate relative to the protective structure;
   in response to the intermediate electrode and the second electrode being simultaneously energized, the electroluminescent illuminator is illuminated to enable the illumination function, and light is emitted from the side of the protective structure relative to the TFT array substrate; and
   in response to the first electrode, the intermediate electrode, and the second electrode being simultaneously energized, the electroluminescent display and the electroluminescent illuminator are simultaneously illuminated to enable the display function and the illumination function at the same time.

2. The device as claimed in claim 1, wherein the electroluminescent display further comprises a color filter, or the first electroluminescent unit employs individual red/green/blue (R/G/B) light emission layers.

3. The device as claimed in claim 1, wherein the electroluminescent display and the electroluminescent illuminator are any one of a single stack device, a multi-stack device, an upright device, or an inverted device.

4. The device as claimed in claim 1, wherein the electroluminescent display and the electroluminescent illuminator are a light-emitting device comprising an organic light-emitting diode, a quantum dot light-emitting diode, or a combination of both.

5. The device as claimed in claim 1, wherein the intermediate electrode is a single layer electrode structure made of a metal material or a 3-layer electrode structure laminated in an order of metal oxide/metal/metal oxide, and a thickness of the intermediate electrode is greater than or equal to 100 nm.

6. The device as claimed in claim 1, wherein the first electroluminescent unit is configured to emit monochromatic light or multi-band mixed light, and the second electroluminescent unit is configured to emit monochromatic light or multi-band mixed light.

7. The device as claimed in claim 1, wherein the protective structure comprises an encapsulation structure and a cover sequentially formed on the second electrode, or the protective structure serves as a thin film encapsulation layer formed on the second electrode.

8. The device as claimed in claim 1, wherein the first electroluminescent unit and/or the second electroluminescent unit comprises at least two light emission layers, and a first charge generation layer and a second charge generation layer are disposed between the two adjacent light emission layers of the same electroluminescent unit, and the first charge generation layer and the second charge generation layer are different types of charge generation layers.

9. An electroluminescent display and illuminating device, comprising:
   a thin film transistor (TFT) array substrate;
   a first electrode and a first electroluminescent unit sequentially disposed on the TFT array substrate, wherein the first electroluminescent unit comprises at least one light emission layer;
   an intermediate electrode formed on the first electroluminescent unit;
   a second electroluminescent unit and a second electrode sequentially disposed on the intermediate electrode, wherein the second electroluminescent unit comprises at least one light emission layer; and
   a protective structure formed on the second electrode;

wherein the first electrode, the first electroluminescent unit, and the intermediate electrode form an electroluminescent display, and the TFT array substrate is configured to drive the electroluminescent display to achieve a display function; the intermediate electrode, the second electroluminescent unit, and the second electrode form an electroluminescent illuminator;

the first electrode and the second electrode are connected to the same polarity, and the intermediate electrode and the first electrode are connected to opposite polarity, thereby achieving the display function on a side of the TFT array substrate, and achieving a illumination function on a side of the protective structure.

10. The device as claimed in claim 9, wherein in response to the first electrode and the intermediate electrode being simultaneously energized, the electroluminescent display is simultaneously illuminated to enable the display function, and light is emitted from the side of the TFT array substrate relative to the protective structure;

in response to the intermediate electrode and the second electrode being simultaneously energized, the electroluminescent illuminator is illuminated to enable the illumination function, and light is emitted from the side of the protective structure relative to the TFT array substrate; and in response to the first electrode, the intermediate electrode, and the second electrode being simultaneously energized, the electroluminescent display and the electroluminescent illuminator are simultaneously illuminated to enable the display function and the illumination function at the same time.

11. The device as claimed in claim 9, wherein the electroluminescent display further comprises a color filter, or the first electroluminescent unit employs individual red/green/blue (R/G/B) light emission layers.

12. The device as claimed in claim 9, wherein the electroluminescent display and the electroluminescent illuminator are any one of a single stack device, a multi-stack device, an upright device, or an inverted device.

13. The device as claimed in claim 9, wherein the electroluminescent display and the electroluminescent illuminator are a light-emitting device comprising an organic light-emitting device, a quantum dot light-emitting device, or a combination of both.

14. The device as claimed in claim 9, wherein the first electrode is a patterned electrode and comprises a plurality of first sub-electrodes which are spaced apart from each other.

15. The device as claimed in claim 9, wherein the intermediate electrode is a total reflection electrode.

16. The device as claimed in claim 9, wherein the intermediate electrode is a single layer electrode structure made of a metal material or a 3-layer electrode structure laminated in an order of metal oxide/metal/metal oxide, and a thickness of the intermediate electrode is greater than or equal to 100 nm.

17. The device as claimed in claim 9, wherein the first electroluminescent unit is configured to emit monochromatic light or multi-band mixed light, and the second electroluminescent unit is configured to emit monochromatic light or multi-band mixed light.

18. The device as claimed in claim 9, wherein the protective structure comprises an encapsulation structure and a cover sequentially formed on the second electrode, or the protective structure serves as a thin film encapsulation layer formed on the second electrode.

19. The device as claimed in claim 9, wherein the first electroluminescent unit and/or the second electroluminescent unit comprises at least two light emission layers, and a first charge generation layer and a second charge generation layer are disposed between the two adjacent light emission layers of the same electroluminescent unit, and the first charge generation layer and the second charge generation layer are different types of charge generation layers.

20. A manufacturing method of an electroluminescent display and illuminating device, comprising steps as follows:

providing a thin film transistor (TFT) array substrate;

sequentially disposing a first electrode and a first electroluminescent unit on the TFT array substrate, wherein the first electroluminescent unit comprises at least one light emission layer;

forming an intermediate electrode on the first electroluminescent unit;

sequentially disposing a second electroluminescent unit and a second electrode on the intermediate electrode, wherein the second electroluminescent unit comprises at least one light emission layer;

forming a protective structure on the second electrode; and connecting the first electrode and the second electrode to the same polarity, and connecting the intermediate electrode and the first electrode to opposite polarity, thereby achieving a display function on a side of the TFT array substrate, and achieving a illumination function on a side of the protective structure.

* * * * *